(12) United States Patent
Ng et al.

(10) Patent No.: US 7,064,027 B2
(45) Date of Patent: Jun. 20, 2006

(54) METHOD AND STRUCTURE TO USE AN ETCH RESISTANT LINER ON TRANSISTOR GATE STRUCTURE TO ACHIEVE HIGH DEVICE PERFORMANCE

(75) Inventors: Hung Y. Ng, New Milford, NJ (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 95 days.

(21) Appl. No.: 10/713,227

(22) Filed: Nov. 13, 2003

(65) Prior Publication Data

US 2005/0104095 A1 May 19, 2005

(51) Int. Cl.
*H01L 21/8234* (2006.01)

(52) U.S. Cl. ............ 438/238; 438/199; 438/382; 438/216

(58) Field of Classification Search ............ 438/238, 438/382, 199, 216
See application file for complete search history.

(56) References Cited

U.S. PATENT DOCUMENTS

| 5,525,552 | A | 6/1996 | Huang |
|---|---|---|---|
| 5,633,781 | A | 5/1997 | Saenger et al. |
| 5,747,373 | A * | 5/1998 | Yu ............................ 438/305 |
| 5,904,517 | A | 5/1999 | Gardner et al. |
| 6,008,095 | A | 12/1999 | Gardner et al. |
| 6,127,235 | A | 10/2000 | Gardner et al. |
| 6,194,748 | B1 | 2/2001 | Yu |
| 6,207,485 | B1 | 3/2001 | Gardner et al. |
| 6,271,563 | B1 | 8/2001 | Yu et al. |
| 6,512,273 | B1 * | 1/2003 | Krivokapic et al. ........ 257/369 |
| 6,524,913 | B1 | 2/2003 | Lin et al. |
| 6,613,637 | B1 * | 9/2003 | Lee et al. .................... 438/301 |
| 6,743,669 | B1 * | 6/2004 | Lin et al. .................... 438/238 |
| 6,753,242 | B1 * | 6/2004 | Yeap et al. .................. 438/595 |
| 6,800,909 | B1 * | 10/2004 | Sugiyama et al. .......... 257/408 |
| 6,908,822 | B1 * | 6/2005 | Rendon et al. ............. 438/303 |
| 2002/0028555 | A1 | 3/2002 | Boyd et al. |
| 2002/0037611 | A1 * | 3/2002 | Shin et al. .................. 438/199 |
| 2003/0071290 | A1 | 4/2003 | Yu et al. |

FOREIGN PATENT DOCUMENTS

| DE | 4143115 A1 | 9/1992 |
|---|---|---|
| JP | 4152535 A | 5/1992 |
| JP | 5211163 A | 8/1993 |
| WO | WO 03/032400 A1 | 4/2003 |

* cited by examiner

*Primary Examiner*—Michael Trinh
*Assistant Examiner*—Christy Novacek
(74) *Attorney, Agent, or Firm*—Schmeiser, Olsen & Watts; William H. Steinberg

(57) ABSTRACT

An etch resistant liner covering sidewalls of a transistor gate stack and along a portion of the substrate at a base of the transistor gate stack. The liner prevents silicide formation on the sidewalls of the gate stack, which may produce electrical shorting, and determines the location of silicide formation within source and drain regions within the substrate at the base of the transistor gate stack. The liner also covers a resistor gate stack preventing silicide formation within or adjacent to the resistor gate stack.

20 Claims, 10 Drawing Sheets

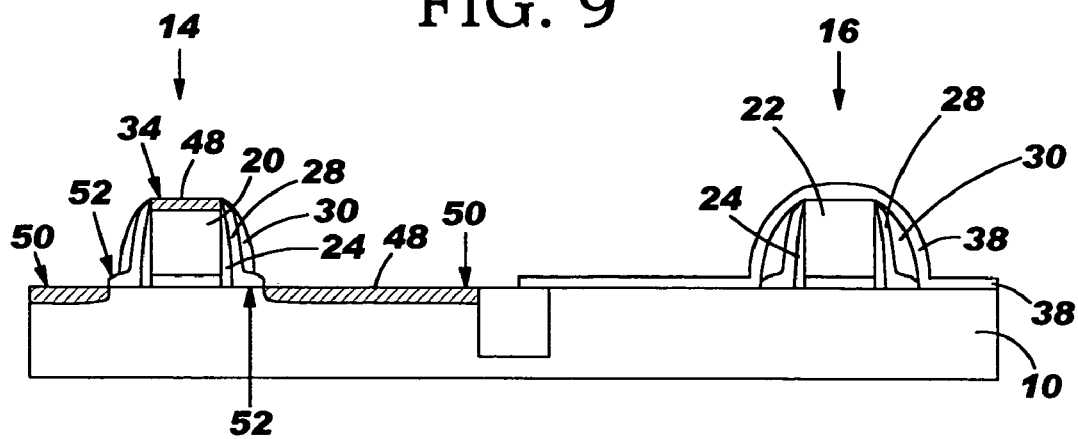
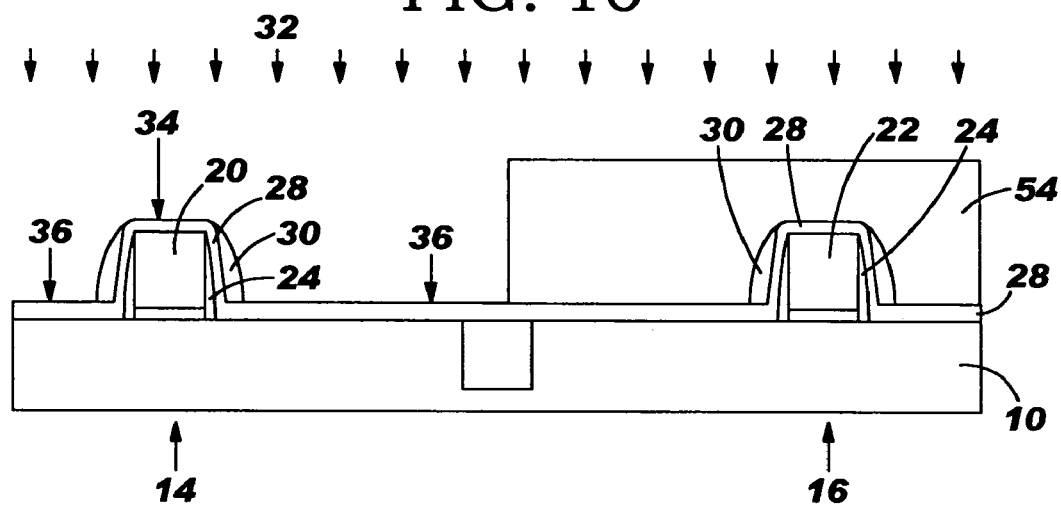
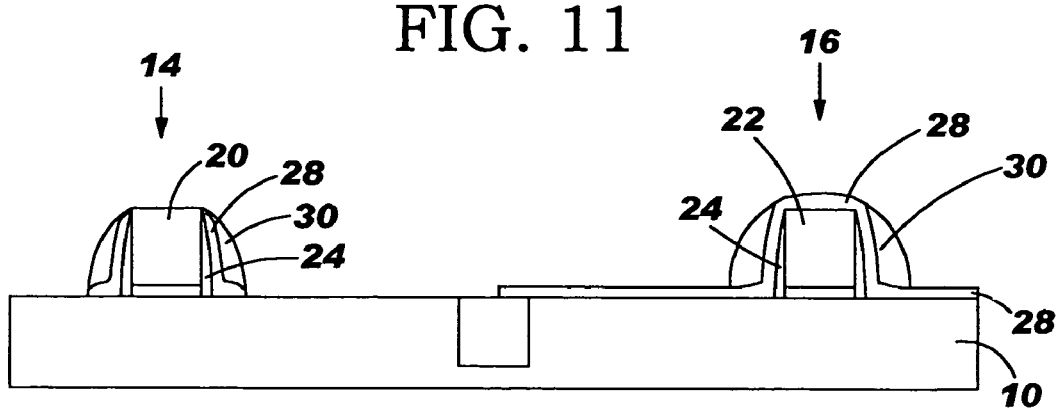

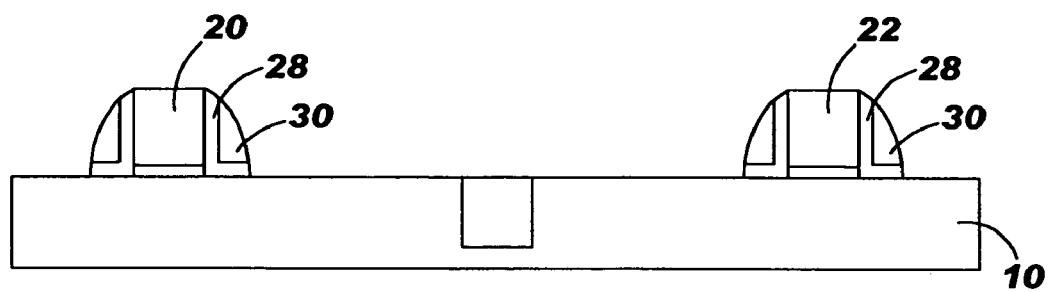
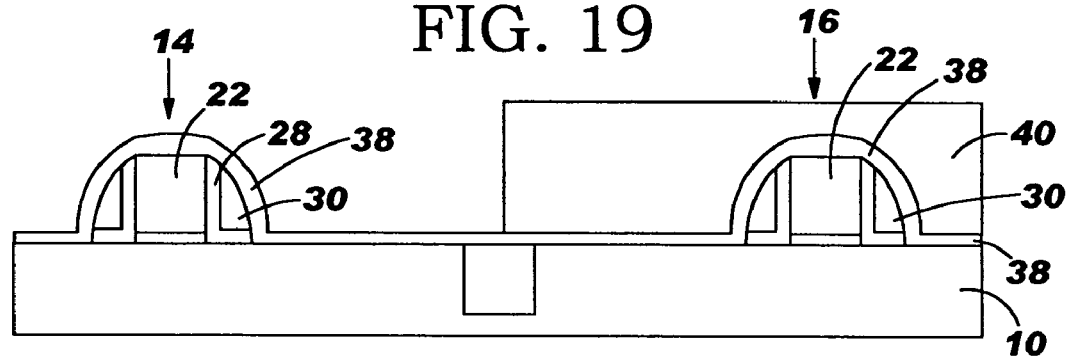
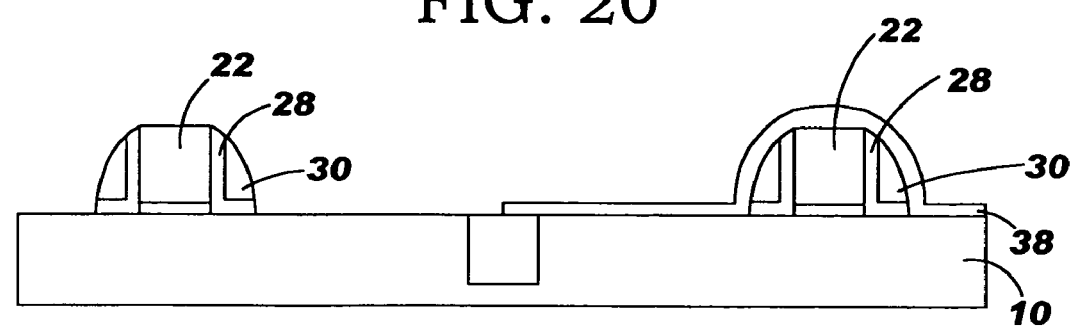

METHOD AND STRUCTURE TO USE AN ETCH RESISTANT LINER ON TRANSISTOR GATE STRUCTURE TO ACHIEVE HIGH DEVICE PERFORMANCE

BACKGROUND OF THE INVENTION

1. Technical Field

The present invention relates generally to semiconductor devices and the fabrication thereof, and more particularly, to the design of a semiconductor device using an etch resistant liner on a transistor gate and/or a resistor gate.

2. Related Art

Spacers are conventionally used to protect the sidewalls of a gate stack during the processes required to form silicide on a top surface of the gate stack and within the source/drain region of a transistor. Prior to the formation of silicide the wafer undergoes a conventional preclean process to prepare the top surface of the gate stack and the source/drain region for silicide formation. Unfortunately, the spacers are not resistant enough to withstand the proclean process, and portions of the spacer may become inadvertently removed. As a result, portions of the gate stack sidewall become exposed. The exposed portions of the gate stack sidewall are then susceptible to silicide formation. Silicide formed on the sidewalls of the gate stack can lead to electrical shorts between the silicide on the top of the gate stack and the silicide within the source/drain region at the base of the gate stack. As semiconductor devices are continually being scaled down, and the distance between the top of the gate stack and the source/drain region is being reduced, the likelihood of electrical shorts due to the silicide formed on the sidewalls of the gate stack increases.

The preclean process mentioned above also tends to affect resistors formed adjacent to the transistors. In order to maintain the designed resistance it is desirable to prevent silicide formation within or around the resistor gate stack. Portions of the spacers protecting the sidewalls of the resistor gate stack may become removed during the preclean process. As with the transistor, the exposed portions of the resistor gate stack are susceptible to silicide formation, which tends to decrease resistance.

Therefore, there is a need in the industry for a method of forming a transistor and/or resistor gate that overcomes the above problems.

SUMMARY OF THE INVENTION

The present invention provides an etch resistant liner formed over a transistor gate stack and a resistor gate stack that solves the above-stated problems.

A first aspect of the invention provides a method of forming a semiconductor device, comprising: providing a substrate having a gate stack on the surface of the substrate; forming an etch resistant liner over the gate stack; forming a spacer over the liner along sidewalls of the gate stack; removing the liner from regions of the substrate and gate stack not covered by the spacer, and leaving the liner in regions of the substrate and gate stack covered by the spacer; and forming a conductive material in the regions of the substrate and gate stack not covered by the liner.

A second aspect of the invention provides a method of forming a semiconductor device, comprising: providing a substrate having a first gate stack and a second gate stack on the surface of the substrate; forming a liner over the first and second gate stacks; forming a spacer over the liner and along the sidewalls of the first and second gate stacks; removing the liner from regions of the substrate and gate stacks not covered by the spacer; forming a protective layer over the second gate stack; and forming a conductive material in the regions not covered by the liner.

A third aspect of the invention provides a semiconductor device, comprising: a gate stack formed on a substrate; an etch resistant liner covering sidewalls of the gate stack and a portion of the substrate adjacent the gate stack; a spacer on the liner along the sidewalls of the gate stack; and a conductive material within a top region of the gate stack and within source and drain regions of the substrate, wherein the source and drain regions are located where the liner ends on the substrate.

A fourth aspect of the invention provides a semiconductor device, comprising: a transistor gate stack and a resistor gate stack formed on a substrate; a first spacer along sidewalls of the transistor and resistor gate stacks; a liner over the first spacer of the transistor and resistor gate stacks, and along a portion of the substrate at a base of the transistor and resistor gate stacks, wherein the liner extends along the substrate to a designated location of transistor source and drain regions; a spacer on the liner along the sidewalls of at least the transistor gate stack; and a conductive material within a top surface of the transistor gate stack and within the transistor source and drain regions.

The foregoing and other features and advantages of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein:

FIG. 9 depicts the substrate of FIG. 8a having a conductive material formed in select regions of the substrate;

FIG. 10 depicts a portion of a semiconductor device in accordance with a second embodiment having a first and a second gate stack formed on a substrate, and a photoresist layer formed over the second gate stack region during an ion implant;

FIG. 11 depicts the substrate of FIG. 10 having portions of the liner removed from the surface of the substrate in the first gate stack region;

FIG. 18 depicts the substrate of FIG. 17 having portions of the liner removed from the surface of the substrate;

FIG. 19 depicts the substrate of FIG. 18 having a protective layer deposited over the surface of the substrate, and a photoresist layer formed over the second gate stack region;

FIG. 20 depicts the substrate of FIG. 19 after the protective layer is removed from the surface of the substrate in the first gate stack region;

DESCRIPTION OF THE PREFERRED EMBODIMENTS

Although certain embodiments of the present invention will be shown and described in detail, it should be understood that various changes and modifications might be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1:
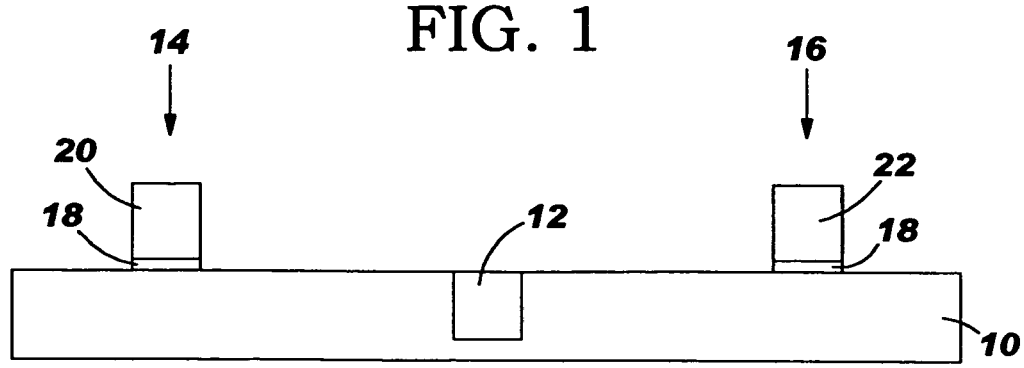
FIG. 1 depicts a portion of a semiconductor device in accordance with a first embodiment having a first and a second gate stack formed on a substrate.

FIG. 1 shows a semiconductor substrate 10 having an STI 12 formed within the substrate 10 as is known in the art. The substrate 10 may comprise silicon, or other similarly used material. Active regions 14, 16 will be formed on each side of the STI 12. In particular, a transistor will be formed in the first active region 14, and a resistor will be formed in the second active region 16. Each active region 14, 16 has a gate dielectric layer 18 separating the substrate 10 from a gate stack 20, 22. The gate stacks 20, 22 may be formed using conventional processes, and comprise polysilicon, or other similarly used material.

Figure 2:
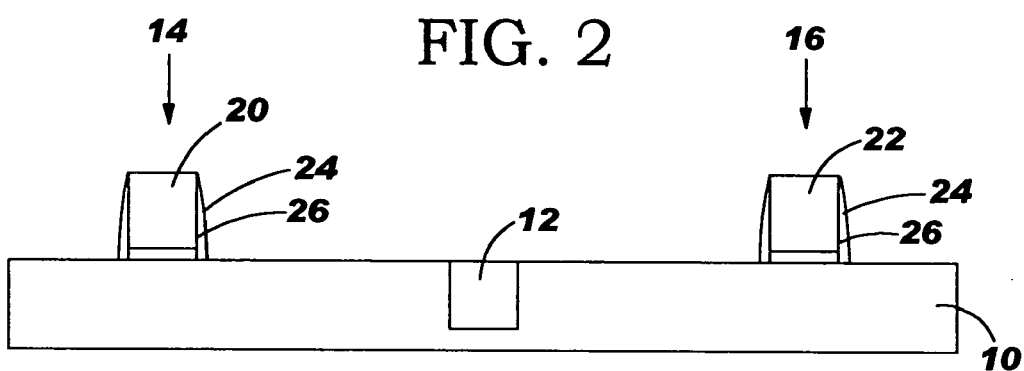
FIG. 2 depicts the substrate of FIG. 1 having a first spacer formed along sidewalls of the gate stacks.

As illustrated in FIG. 2, a first spacer 24 is formed along sidewalls 26 of the gate stacks 20, 22. The first spacer 24 may comprise an oxide material, or other similarly used material. The first spacer 24 may be formed using an oxidation process wherein oxide is deposited on the sidewalls 26 using chemical-vapor deposition (CVD), plasma-enhanced chemical-vapor deposition (PECVD), or other similar process. The oxide is then etched using a reactive ion etch (RIE), or other similar process. The first spacer 24 may be formed having a thickness of about 50 Å–200 Å.

Figure 3:
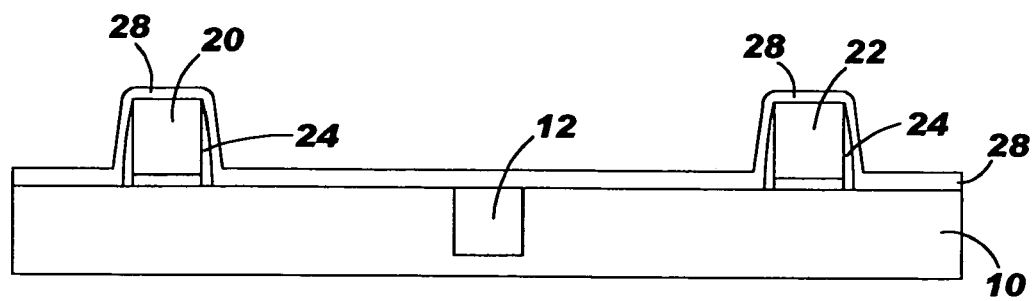
FIG. 3 depicts the substrate of FIG. 2 having a liner formed over the surface of the substrate.

As illustrated in FIG. 3, a liner 28 is formed over the surface of the substrate 10 conformally covering the gate stacks 20, 22 and first spacer 24. The liner 28 comprises an etch resistant material, e.g., a material having a high dielectric constant, (wherein "high" refers to a dielectric constant (K) of at least 7, and may be in the range of about 7–150). For example, the liner 28 may comprise a high K material such as $Al_2O_3$, $HfO_2$, $Ta_2O_3$, or other similar material. Alternatively, the liner 28 may comprise an etch resistant material other than a high K material such as SiC. The liner 28 may be formed having a thickness in the range of about 25 Å–250 Å. The liner 28 may be conformally deposited using CVD, atomic layer deposition (ALD), plasma-assisted CVD, sputtering, or other similar process.

Figure 4:
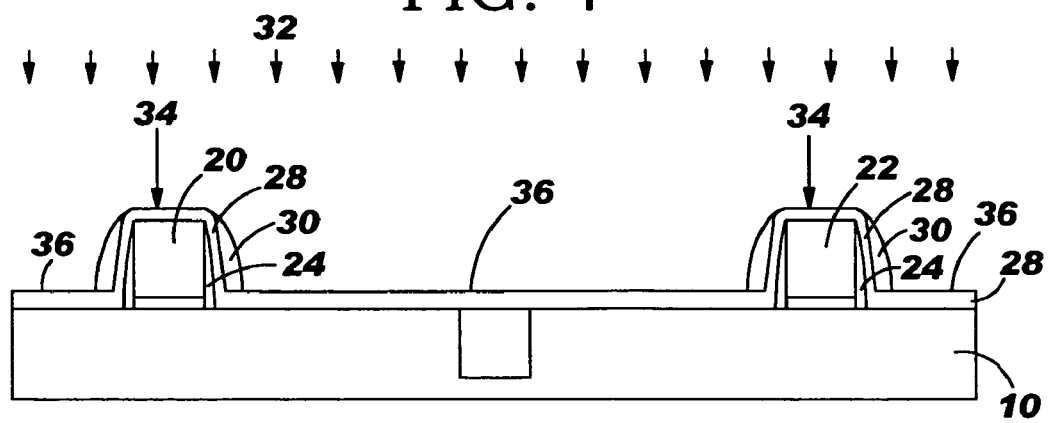
FIG. 4 depicts the substrate of FIG. 3 having a second spacer formed over the liner and along the gate stack sidewalls, and an ion implant performed on the surface of the substrate.

As illustrated in FIG. 4, a second spacer 30 is formed on the liner 28 along the sidewalls 26 of the gate stacks 20, 22. The second spacer 30 may comprise an insulative material, such as a nitride, e.g., $Si_3N_4$, or other similarly used insulative material. The material for the second spacer 30 may be deposited using CVD, PECVD, or other similar process. Thereafter, a RIE, or other similar process, may be used to remove the excess material thereby forming the second spacer 30. The second spacer 30 may be formed having a thickness of about 200 Å–800 Å.

Figure 5:
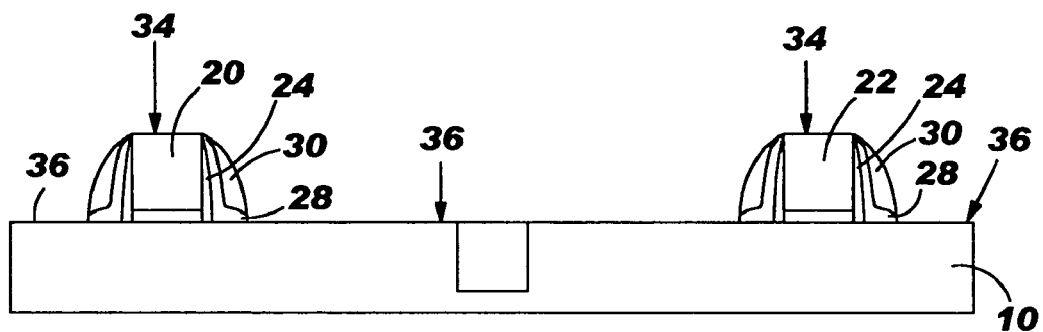
FIG. 5 depicts the substrate of FIG. 4 having portions of the liner removed from the surface of the substrate.

Ions 32, such as Ge, Xe, Si, etc., are then implanted into the surface of the substrate 10 in order to damage exposed regions 34, 36 of the liner 28, or the regions 34, 36 not covered by the second spacer 30. Specifically, the exposed region 34 of the liner 28 on top of the gate stacks 20, 22, and the exposed regions 36 of the liner 28 on the substrate 10 adjacent the gate stacks 20, 22 are intentionally damaged by the ion implant. Thereafter, the damaged portions of the liner 28 in regions 34 and 36 are chemically removed using a wet etch, as illustrated in FIG. 5.

Figure 6:
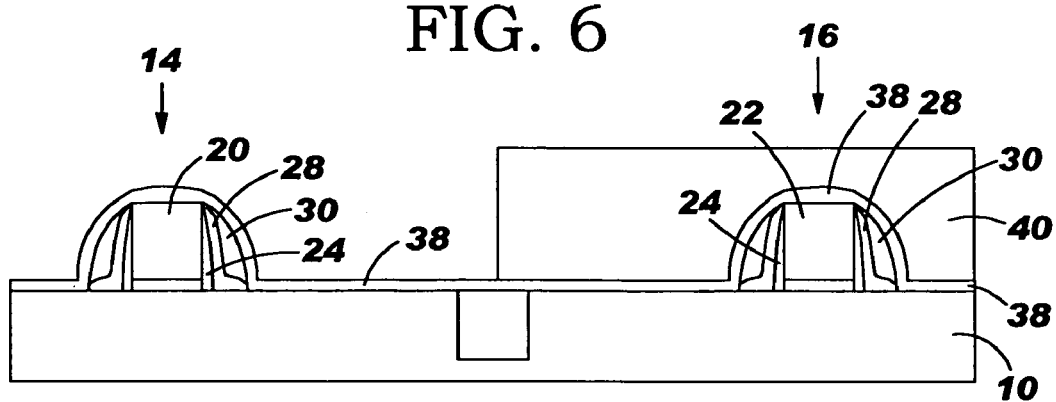
FIG. 6 depicts the substrate of FIG. 5 having a protective layer deposited over the surface of the substrate, and a photoresist layer formed over the second gate stack region.
Figure 7:
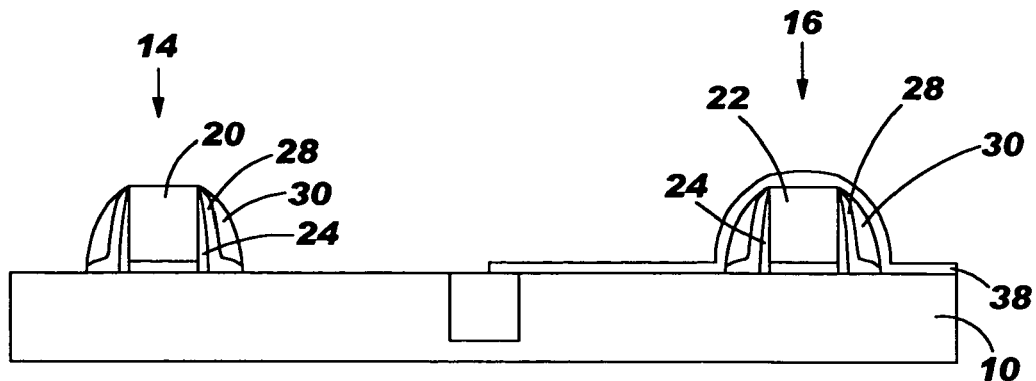
FIG. 7 depicts the substrate of FIG. 6 after the protective layer is removed from the surface of the substrate in the first gate stack region.

As illustrated in FIG. 6, an insulative layer 38 is conformally deposited over the surface of the substrate 10. A photoresist 40 is then deposited, patterned and etched, using conventional processes, in order to cover the resistor region 16 of the substrate 10 and leave the transistor region 14 of the substrate 10 uncovered. An etch process, such as a RIE, or other similar process, may be performed to remove the insulative layer 38 from the surface of the substrate 10 in the transistor region 14. The remaining photoresist 40 is removed leaving a protective layer 38 over the resistor region 16 of the substrate 10, as illustrated in FIG. 7.

Figure 8A:
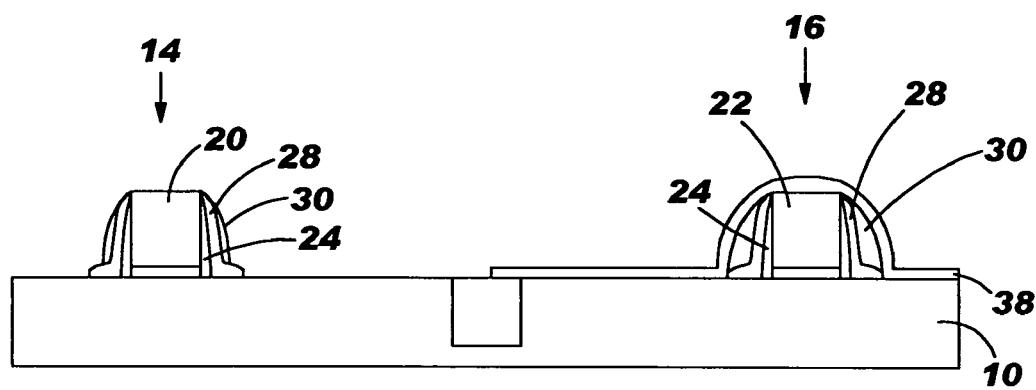
FIG. 8a depicts the substrate of FIG. 7 following a preclean process.
Figure 8B:
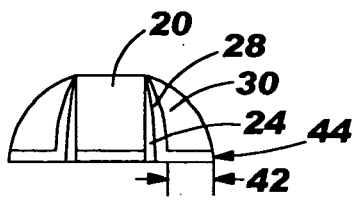
FIG. 8b depicts the first gate stack of FIG. 7 before the preclean process.
Figure 8C:
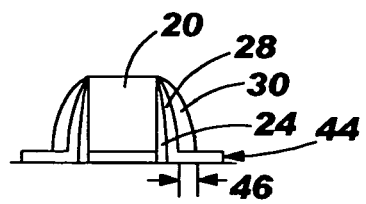
FIG. 8c depicts the first gate stack of FIG. 8a after the preclean process.

The surface of the substrate 10 is cleaned, using a "preclean" process, to prepare the surface of the substrate 10 in the transistor region 14 for the formation of a conductive material. For example, a hydro-flouride (HF) chemical preclean process may be performed. During the preclean process the second spacer 30 is unintentionally etched due to a lack of etch resistance. As a result, the thickness of the second spacer 30 is decreased, as illustrated in FIGS. 8a–c. Specifically, FIG. 8b shows the thickness 42 of the second spacer 30 before the preclean process is performed. At that time the thickness 42 of the second spacer 30 is such that it extends to about an end 44 of the liner 28 that is adjacent to, or along a portion of the substrate 10 at, the base of the gate stack 20. After the preclean process the thickness 46 (FIG. 8c) of the second spacer 30 is reduced, such that the second spacer 30 does not extend to the end 44 of the liner 28 adjacent to, or along a portion of the substrate at, the base of the gate stack 20. In this embodiment, the second spacer 30 on the resistor gate stack 22 is not affected by the preclean because the gate stack 22 and spacers 24, 30 are protected by layer 38.

As illustrated in FIG. 9, a conductive material 48, e.g., silicide, or other similar material, is formed on the top region 34 of the transistor gate stack 20 and in source/drain regions 50 of the transistor. The conductive material 48 may be formed by uniformly depositing a layer of a refractory metal, such as cobalt or titanium, over the surface of the substrate 10, using PVD, CVD, sputtering, or other similar process. The metal is then annealed, for example, exposed to 700° C. for about 30 seconds. During the annealing process the metal diffuses into the exposed regions of silicon to form silicide. Thereafter, non-reacted cobalt metal is chemically removed.

It should be noted that the liner 28 defines, or determines, where the conductive material 48 is formed in relation to the transistor gate stack 20. If the liner 28 had not been used the conductive material 48 within the source/drain region 50 would have formed much closer to the base of the gate stack 20, because the preclean process performed before the conductive material 48 is formed reduces the thickness 46 of the second spacer 30 (refer to FIG. 8c). The liner 28 covers the silicon within the substrate 10 in region 52, (the region that was originally covered by the second spacer 30 prior to the preclean process), thereby preventing conductive material 48 from forming in that region 52. Had the conductive material 48 formed too close to the base of the gate stack 20 there would be a greater likelihood of electrical shorts between the conductive material 48 on the top region 34 of the transistor gate stack 20 and the conductive material 48 within the source/drain region 50 of the transistor gate stack 20.

Additionally, the liner 28 prevents the removal of the first spacer 24 from the sidewalls 26 of the gate stacks 20, 22 during the preclean process. Since there are no breaches formed within the first spacer 24, the sidewalls of the gate stacks 20, 22 are not susceptible to formation of the conductive material 48. As described in the related art, conductive material 48 formed on the sidewalls 26 of the transistor gate stack 20 increases the occurrence of electrical shorting between the conductive material 48 on the top region of the gate stack 20 and the conductive material 48 within the source/drain region 50. Also, conductive material 48 formed on the sidewalls 26 of the resistor gate stack 22 decreases resistance of the resistor.

A second embodiment is illustrated in FIGS. 10–15. In this embodiment the liner 28 on the top region 34 of the resistor gate stack 22, and the liner 28 in the region 36 adjacent the resistor gate stack 22 are not removed. In particular, following formation of the second spacer 30 on the liner 28 along the sidewalls 26 of the transistor and resistor gate stacks 20, 22, in accordance with the first embodiment (FIGS. 1–4), a masking layer, or photoresist layer 54 is deposited over the substrate 10. As illustrated in FIG. 10, the photoresist layer 54 is patterned and etched to expose the transistor region 14 of the substrate 10. The ions 32 implanted, as described above, will damage the exposed regions 34, 36 of the liner 28 in the transistor region 14 only, but the liner 28 in the resistor region 16 will not be damaged.

Figure 12:
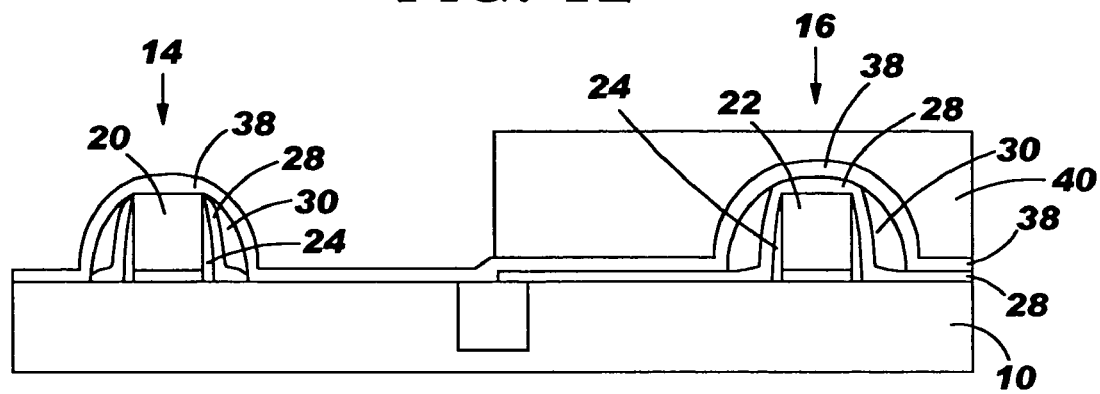
FIG. 12 depicts the substrate of FIG. 11 having a protective layer deposited over the surface of the substrate, and a photoresist layer formed over the second gate stack region.
Figure 13:
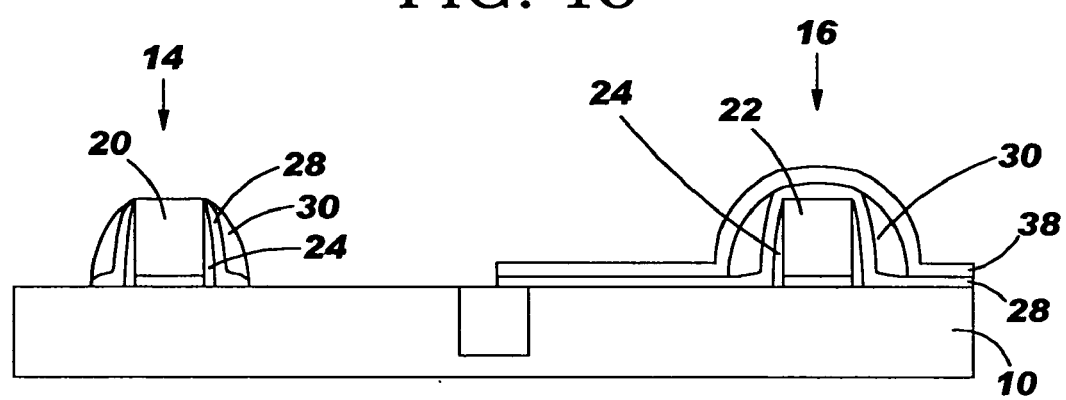
FIG. 13 depicts the substrate of FIG. 12 after the protective layer is removed from the surface of the substrate in the first gate stack region.

Thereafter, the wet etch is performed to remove the damaged portions of the liner 28 in regions 34 and 36, and the photoresist 54 is removed, as illustrated in FIG. 11. As described in connection with the first embodiment, the protective layer 38 is conformally deposited over the surface of the substrate 10 (FIG. 12). A photoresist 40 is then deposited, patterned and etched, using conventional processes, to cover the resistor region 16 of the substrate 10 and leave the transistor region 14 of the substrate 10 uncovered (FIG. 12). An etch process, such as a RIE, or other similar process, is performed to remove the protective layer 38 from the surface of the substrate 10 in the transistor region 14, as illustrated in FIG. 13. The remaining photoresist 40 is also removed leaving the protective layer 38 over the resistor region 16 of the substrate 10 (FIG. 13).

Figure 14:
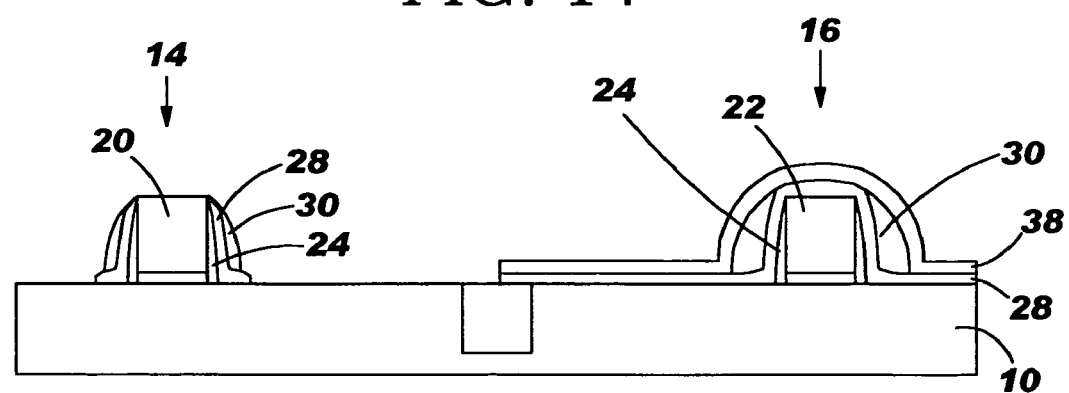
FIG. 14 depicts the substrate of FIG. 13 following a preclean process.

Thereafter, the preclean process is performed to prepare the surface of the substrate 10 in the transistor region 14 for the formation of the conductive material 48. As described above, the thickness of the second spacer 30 decreases during the preclean process (FIG. 14). The second spacer 30 along the sidewalls of the resistor gate stack 22 is protected by layer 38 during the preclean process. In addition, the first spacer 24 and the resistor gate stack 22 are not affected by the preclean because the gate stack 22 and the first spacer 24 are protected by liner 28.

Figure 15:
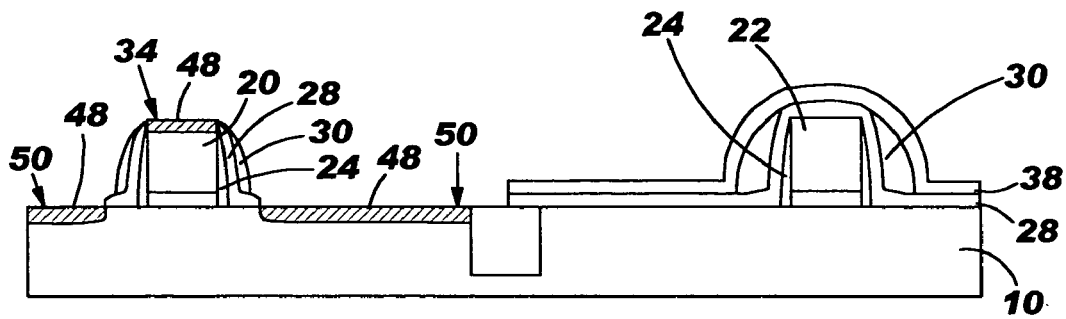
FIG. 15 depicts the substrate of FIG. 14 having a conductive material formed in select regions of the substrate.

Conductive material 48 is then formed on the top region 34 of the transistor gate stack 20 and in the source/drain regions 50 of the transistor (FIG. 15). The resistor region 16, however, forms no conductive material 48 because the liner 28 covering the entire surface of the resistor region 16 ensures that there are no breaches in the spacers 24, 30 or protective layer 38 during the conductive material 48 preclean process.

Figure 16:
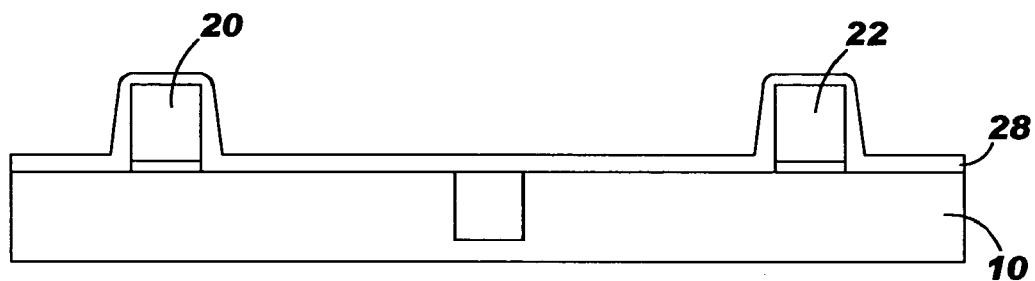
FIG. 16 depicts a portion of a semiconductor device in accordance with a third embodiment having a first and a second gate stack formed on a substrate, and a liner formed over the surface of the substrate.
Figure 17:
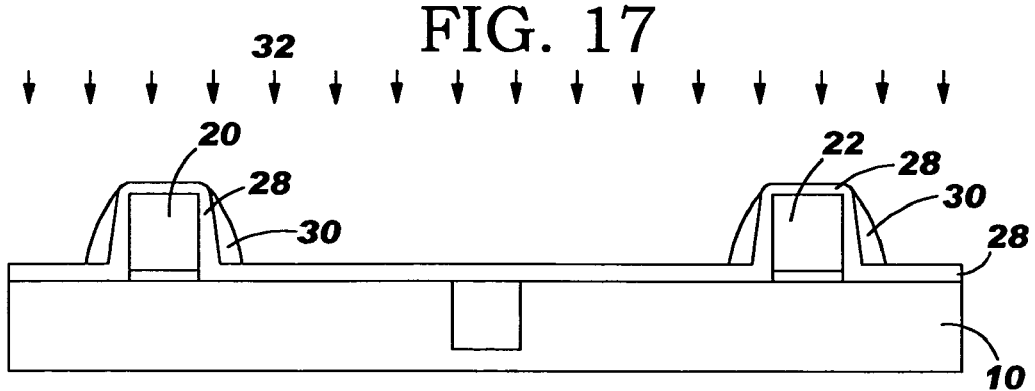
FIG. 17 depicts the substrate of FIG. 16 during ion implantation.

A third embodiment is illustrated in FIGS. 16–22. Instead of forming the first spacer 24 along the sidewalls 26 of the transistor gate stack 20 and the resistor gate stack 22, the liner 28 is formed directly on the gate stacks 20, 22, as illustrated in FIG. 16. Thereafter, spacer 30 is formed on the liner 28 along the sidewalls 26 of the gate stacks 20, 22, as illustrated in FIG. 17.

Ions 32 may then be implanted into the surface of the substrate 10 to damage exposed regions of the liner 30, as illustrated in FIG. 17. As described in the first embodiment, the exposed regions of the liner 28 are intentionally damaged by the ion implantation. The damaged portions of the liner 28 are then chemically removed using a wet etch, as illustrated in FIG. 18.

As illustrated in FIG. 19, layer 38 is conformally deposited over the surface of the substrate 10. A photoresist 40 is then deposited, patterned and etched, using conventional processes, to cover the resistor region 16 of the substrate 10 and leave the transistor region 14 of the substrate 10 uncovered. An etch process removes layer 38 from the surface of the substrate 10 in the transistor region 14. The remaining photoresist 40 is removed leaving a protective layer 38 over the resistor region 16 of the substrate 10, as illustrated in FIG. 20.

Figure 21:
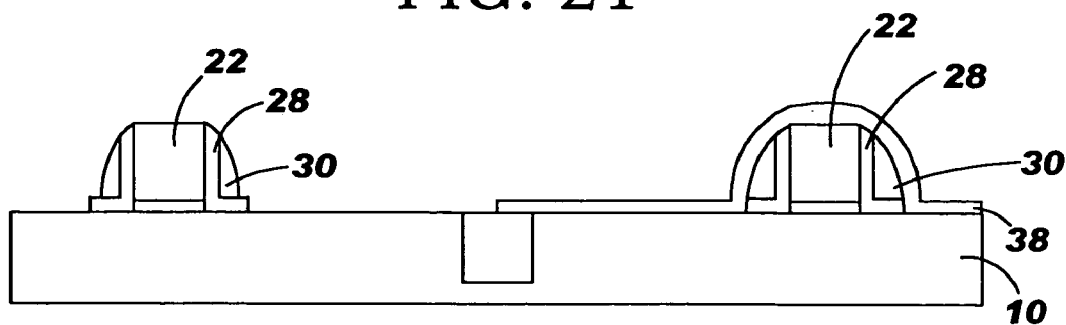
FIG. 21 depicts the substrate of FIG. 20 following a preclean process.
Figure 22:
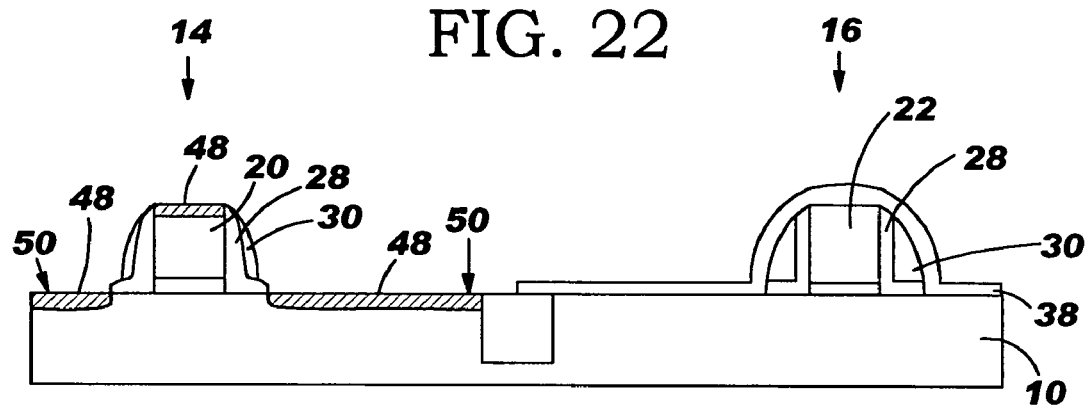
FIG. 22 depicts the substrate of FIG. 21 having a conductive material formed in select regions of the substrate.

The preclean process is performed to prepare the surface of the substrate 10 in the transistor region 14 for the formation of the conductive material 48. As described in the first embodiment, the second spacer 30 is etched during the preclean process, thereby decreasing the thickness of the second spacer 30, as illustrated in FIG. 21. As described in the first embodiment, and illustrated in FIG. 22, the conductive material 48 is formed on the top region 34 of the transistor gate stack 20 and in the source/drain regions 50 of the transistor.

Figure 23:
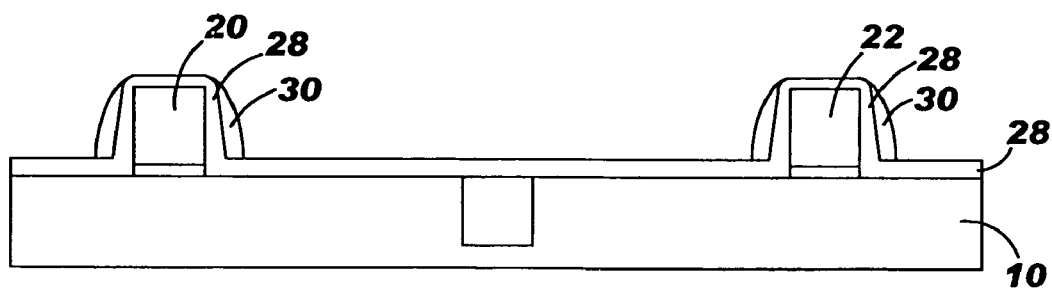
FIG. 23 depicts a portion of a semiconductor device in accordance with a fourth embodiment having a first and a second gate stack formed on a substrate, a liner formed over the surface of the substrate, and a first spacer formed over the liner along sidewalls of the gate stack.
Figure 24:
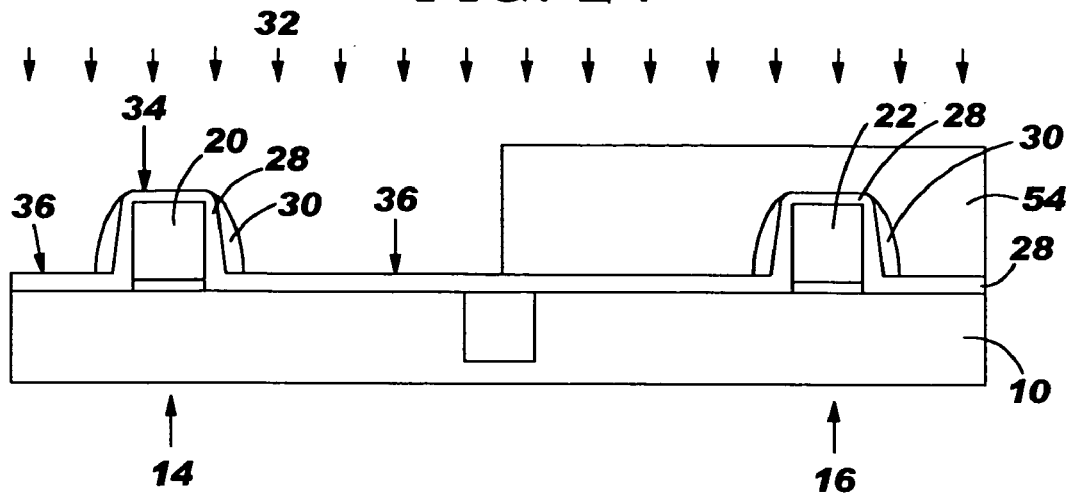
FIG. 24 depicts the substrate of FIG. 23 having a photoresist layer covering the second gate stack region during ion implantation.

A fourth embodiment combines portions of the second and third embodiments, and is illustrated in FIGS. 16 and 23–29. As with the third embodiment above, the liner 28 is formed directly on the gate stacks 20, 22, without forming the first spacer 24, as illustrated in FIG. 16. Thereafter, spacer 30 is formed on the liner 28 along the sidewalls 26 of the gate stacks 20, 22, as illustrated in FIG. 23. Photoresist layer 54 is then deposited, patterned and etched, as described in the second embodiment, in order to protect the resistor region 16 of the substrate 10 and expose the transistor region 14 of the substrate 10, as illustrated in FIG. 24.

Figure 25:
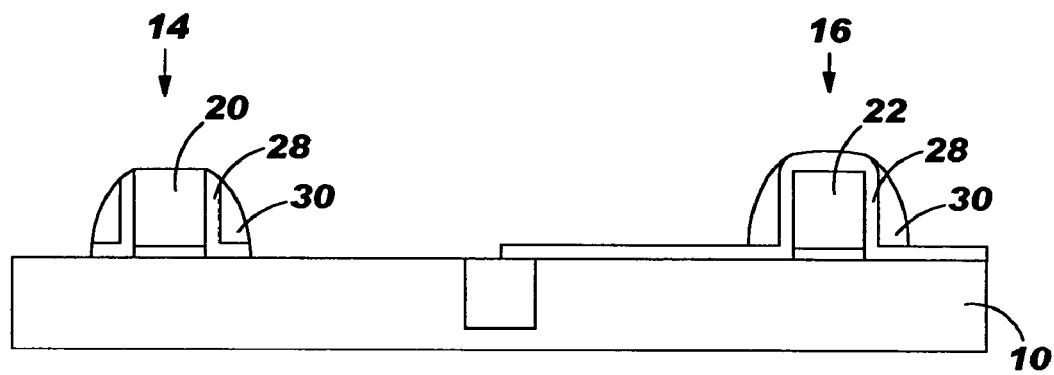
FIG. 25 depicts the substrate of FIG. 24 having portions of the liner removed from the surface of the substrate.

Ions 32 may then be implanted into the surface of the substrate 10 to damage exposed regions 34, 36 of the liner 28, as illustrated in FIG. 24. As described in the first embodiment, the exposed regions 34, 36 of the liner 28 are intentionally damaged by the ion implantation. The photoresist layer 54, however, prevents the resistor region 16 from exposure to the ions 32, thereby protecting the liner 28 in the resistor region 16 from damage, and ultimately from removal. Following implantation of the ions 32, the photoresist layer 54 is removed, and the damaged portions of the liner 28 are then chemically removed using a wet etch, as illustrated in FIG. 25.

Figure 26:
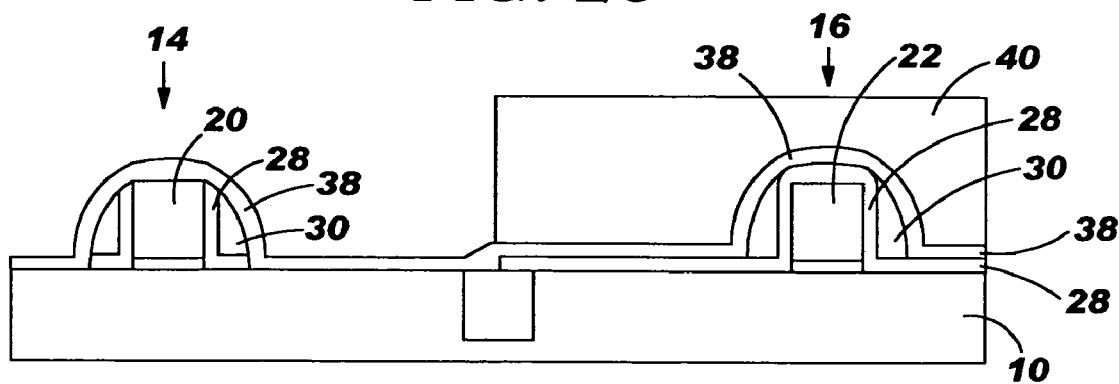
FIG. 26 depicts the substrate of FIG. 25 having a protective layer deposited over the surface of the substrate, and a photoresist layer formed over the second gate stack region.
Figure 27:
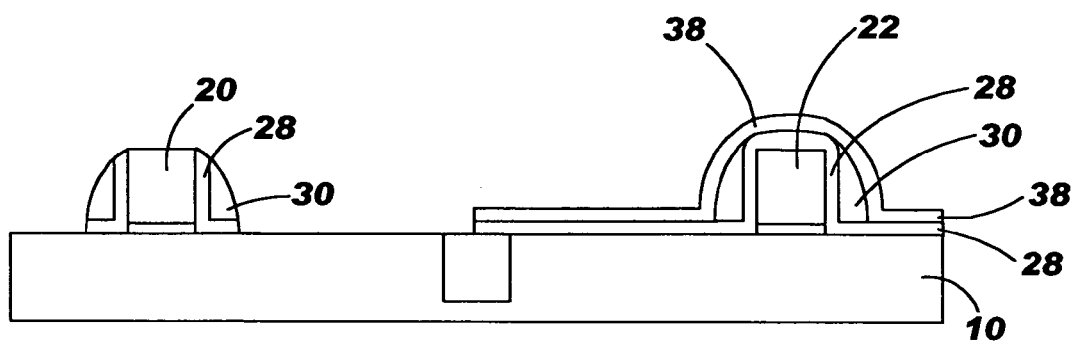
FIG. 27 depicts the substrate of FIG. 26 after the protective layer is removed from the surface of the substrate in the first gate stack region.

As illustrated in FIG. 26, layer 38 is conformally deposited over the surface of the substrate 10. Photoresist 40 is then deposited, patterned and etched to cover the resistor region 16 of the substrate 10 and leave the transistor region 14 of the substrate 10 uncovered. An etch process removes layer 38 from the surface of the substrate 10 in the transistor region 14. The remaining photoresist 40 is removed leaving a protective layer 38 over the resistor region 16 of the substrate 10, as illustrated in FIG. 27.

Figure 28:
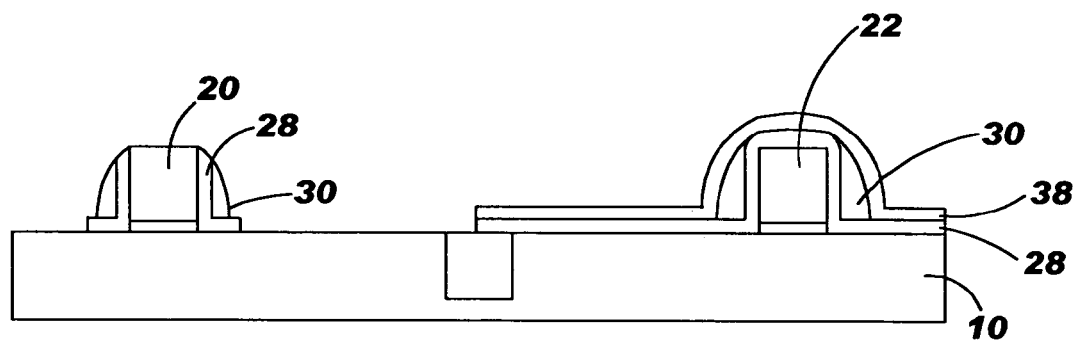
FIG. 28 depicts the substrate of FIG. 27 following a preclean process.
Figure 29:
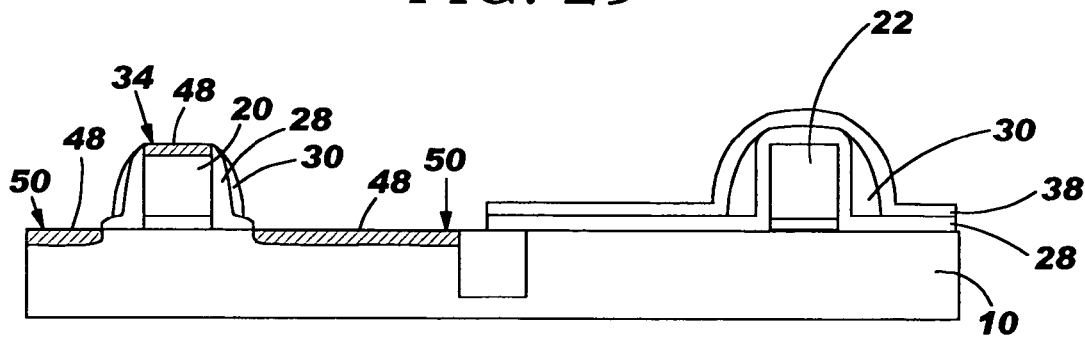
FIG. 29 depicts the substrate of FIG. 28 having a conductive material formed in select regions of the substrate.

The preclean process is performed to prepare the surface of the substrate 10 in the transistor region 14 for the formation of the conductive material 48. As described in the first embodiment, spacer 30 is etched during the preclean process, thereby decreasing the thickness of the spacer 30 (FIG. 28). As described in the first embodiment, and illustrated in FIG. 29, the conductive material 48 is formed on the top region 34 of the transistor gate stack 20 and in the source/drain regions 50 of the transistor.

We claim:

1. A method of forming a semiconductor device, comprising:
    providing a substrate having a first gate stack on a surface of the substrate;
    forming an etch resistant liner over the first gate stack;
    forming a spacer over the liner along sidewalls of the first gate stack;
    removing the liner from regions of the substrate and first gate stack not covered by the spacer, and leaving the liner in regions of the substrate and first gate stack covered by the spacer;
    forming an insulative layer on the surface of the substrate to cover areas of the substrate surrounding the first gate stack, but leaving the first gate stack uncovered;
    performing a preclean process to etch surfaces of the substrate not covered by the insulative layer or the liner, wherein the liner is not removed during the preclean process; and
    after forming the liner, forming a conductive material in the regions of the substrate and first gate stack not covered by the insulative layer or the liner.

2. The method of claim 1, further comprising before forming the liner over the first gate stack:
    providing a second gate stack on the surface of the substrate.

3. The niethod of claim 2, further comprising:
    forming the liner over the second gate stack; and
    forming the spacer over the liner along sidewalls of the second gate stack.

4. The method of claim 3, further comprising before removing the liner from regions of the substrate and first gate stack not covered by the spacer, and leaving the liner in regions of the substrate and first gate stack covered by the spacer:
    depositing a photoresist layer over the liner and the spacer of the second gate stack to prevent removal of the liner from the second gate stack.

5. The method of claim 2, further comprising before forming the liner over the gate stacks:
    forming a first spacer along the sidewalls of the first and second gate stacks.

6. The method of claim 2, wherein the first gate stack comprises a transistor gate stack and the second gate stack comprises a resistor gate stack.

7. The method of claim 1, wherein the liner comprises a material selected from the group consisting of: $Al_2O_3$, $HfO_2$, and $Ta_2O_3$.

8. The method of claim 1, wherein the liner comprises SiC.

9. The method of claim 1, wherein the liner comprises a material having a dielectric constant in the range of about 7–150.

10. The method of claim 1, further comprising during forming the conductive material:
    forming source and drain regions within the substrate, wherein a location of the source and drain regions is determined by an end of the liner created by removing the liner from regions not covered by the spacer.

11. A method of forming a semiconductor device, comprising:
    providing a substrate having a first gate stack and a second gate stack on the surface of the substrate;
    forming a liner over the first and second gate stacks;
    forming a spacer over the liner and along the sidewalls of the first and second gate stacks;
    removing the liner from regions of the substrate and gate stacks not covered by the spacer;
    forming a protective layer over the second gate stack;
    performing a preclean process to etch surfaces of the substrate not covered by the liner, wherein the liner is more resistant to removal during the preclean process than the spacer, such that the liner is not removed while portions of the spacer are removed during the preclean process; and
    after forming the liner, forming a conductive material in the regions not covered by the liner.

12. The method of claim 13, further comprising before forming the liner over the first and second gate stacks:
    forming a first spacer along sidewalls of the first and second gate stacks.

13. The method of claim 11, further comprising before removing the liner from regions of the substrate and gate stack not covered by the spacer:
  depositing a photoresist layer over the liner and the spacer of the second gate stack to prevent removal of the liner from the second gate stack.

14. The method of claim 11, further comprising before forming the conductive material:
  forming an insulative layer over the second gate stack.

15. The method of claim 11, wherein the liner comprises an etch resistant material.

16. The method of claim 11, wherein the liner comprises a material selected from the group consisting of: $Al_2O_3$, $HfO_2$, and $Ta_2O_3$.

17. The method of claim 11, wherein the liner comprises SiC.

18. The method of claim 11, wherein the liner comprises a material having a dielectric constant in the range of about 7–150.

19. The method of claim 11, further comprising during forming the conductive material:
  forming source and drain regions within the substrate, wherein a location of the source and drain regions is determined by an end of the liner created by removing the liner from regions not covered by the spacer.

20. A method of forming a semiconductor device, comprising:
  providing a substrate having a first gate stack on a surface of the substrate;
  forming an etch resistant liner over the first gate stack;
  forming a spacer over the liner along sidewalls of the first gate stack;
  removing the liner from regions of the substrate and first gate stack not covered by the spacer, and leaving remaining portions of the liner in regions of the substrate and first gate stack covered by the spacer, wherein the remaining portions of the liner establish a region, having a distance, adjacent to a base of the first gate stack;
  forming an insulative layer on the surface of the substrate to cover areas of the substrate surrounding the first gate stack, but leaving the first gate stack uncovered;
  performing a preclean process to etch surfaces of the substrate not covered by the liner, wherein the remaining portions of the liner are not removed during the preclean process to maintain the region adjacent to the first gate stack; and
  forming a conductive material within the substrate, wherein the remaining portions of the liner prevent the conductive material from forming in the region adjacent to the base of the first gate stack.

* * * * *

UNITED STATES PATENT AND TRADEMARK OFFICE
CERTIFICATE OF CORRECTION

PATENT NO. : 7,064,027 B2  
APPLICATION NO. : 10/713227  
DATED : June 20, 2006  
INVENTOR(S) : Ng et al.

Page 1 of 1

It is certified that error appears in the above-identified patent and that said Letters Patent is hereby corrected as shown below:

Column 8
Line 12, delete "niethod" and insert -- method --
Line 64, delete "claim 13" and insert -- claim 11 --

Signed and Sealed this

Nineteenth Day of September, 2006

JON W. DUDAS
*Director of the United States Patent and Trademark Office*